United States Patent

Charlton et al.

[11] Patent Number: 6,161,052
[45] Date of Patent: *Dec. 12, 2000

[54] METHOD FOR IDENTIFYING A COMPONENT WITH PHYSICAL CHARACTERIZATION

[75] Inventors: Dave E. Charlton, Star; Roland Ochoa, Boise, both of Id.

[73] Assignee: Micron Electronics, Inc., Nampa, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/959,239

[22] Filed: Oct. 28, 1997

[51] Int. Cl.⁷ .................................................. G06F 19/00
[52] U.S. Cl. ............................................. 700/97; 714/718
[58] Field of Search .................. 29/593, 592.1; 714/718, 719, 720, 721, 723, 724; 700/97

[56] References Cited

U.S. PATENT DOCUMENTS

| | | | |
|---|---|---|---|
| 4,079,505 | 3/1978 | Hirano et al. | 438/11 |
| 4,433,207 | 2/1984 | Best | 380/4 |
| 4,716,124 | 12/1987 | Yerman et al. | 438/15 |
| 5,286,656 | 2/1994 | Keown et al. | 438/18 |
| 5,396,433 | 3/1995 | Kosugi | 7/109 |
| 5,721,741 | 2/1998 | Deas | 714/724 |
| 5,727,000 | 3/1998 | Pizzica | 714/737 |
| 5,844,850 | 12/1998 | Tsutsui et al. | 365/200 |
| 5,844,913 | 12/1998 | Hassoun et al. | 324/537 |
| 5,867,505 | 2/1999 | Beffa | 714/718 |
| 5,907,492 | 5/1999 | Akram et al. | 7/121 |

*Primary Examiner*—William Grant
*Assistant Examiner*—McDieunel Marc
*Attorney, Agent, or Firm*—Knobbe, Martens, Olson & Bear LLP

[57] ABSTRACT

The present invention provides a method for identifying components based upon selected physical characteristics. Initially, a characterization function that will produce a unique characterization value within a set of components, is (or has been) assigned to the set of components. The characterization function is a function of at least one physical characteristic that is shared by the components within the set of components. Next, the measurable physical characteristics defined as part of the characterization function are measured by testing. A characterization value, which is calculated from the assigned characterization function, is determined for each component. Each component that is to be subsequently identified is then identified by its associated characterization value.

31 Claims, 4 Drawing Sheets

METHOD FOR IDENTIFYING A COMPONENT WITH PHYSICAL CHARACTERIZATION

The application Ser. No. 08/959,231 is related to and hereby incorporates by reference the application titled A SYSTEM FOR IDENTIFYING A COMPONENT WITH PHYSICAL CHARACTERIZATION, filed on Oct. 28, 1997.

1. TECHNICAL FIELD

The present invention relates generally to electronic component identification. In particular, the present invention relates to the identification of electronic components based on their physical characteristics.

2. BACKGROUND OF THE INVENTION

Many electronic devices are based on modules made by combining a number of components on a printed circuit board or other substrate. Examples are personal computer motherboards, fax modem add-on boards, memory modules (e.g., DRAM, SDRAM), and device controller boards. For various reasons, it is important to be able to automatically and efficiently identify, throughout the manufacturing process, the individual components that are combined to form an electronic module. The assigned identifier can then serve as the key or label for (or in) one or more files (usually electronic) that relate to the individual component. For example, after components have been installed into a module, it may be desirable to program individual component test information into the module as part of the manufacturing process or to track components for quality control purposes. Therefore, the particular components utilized for the module must be identified in order for their specific test information to be stored and then located for programming into the module or for certain quality control studies to be done.

Some manufacturers apply a barcode label containing an identification number during the initial testing stage of each component to identify it. Each component's test information is then saved against its barcode identification number in a database. During module assembly, component barcode labels are scanned and the stored test information linked to these scanned barcode identifiers is then retrieved and applied to the module. This component identification and information retrieval method is effective; however, the required added step of applying barcodes to the components makes the process less efficient within the production environment. This form of identification can also fail if the barcode label is lost, obscured or sufficiently damaged.

In another identification scheme, the necessary test information may be linked to an identifier number that is incorporated into the component's fuse identification number. This identifier number can later be read during module assembly. The component test information linked to this identifier can then be downloaded into a module programmer or for other uses. Unfortunately, however, a limited number of component manufacturers utilize fuse identification. Therefore, this identification/information retrieval scheme is only effective for a qualified homogeneous set of components; thus, an acceptable "batch" of interchangeable components could not include components supplied from a variety of manufacturers.

When the electronic component is a memory component, some manufacturers use a portion of the component's bit defect map as a unique 'fingerprint' for identification of the particular component. In order to identify the component, a bit error check on the appropriate addresses is performed. The resulting bit error map can then be utilized as an identifier to store and retrieve the entire test information file for the component from a database. No label is added to the component. A drawback of this identification method, however, is that, particularly with low error rate components, a relatively large number of bit locations must be used for the partial bit map identifier in order to produce a unique 'fingerprint' for each component. Thus, with this scheme, excessive time is required for initial or subsequent identification of a given component. Further, being based on errors, it does not work for devices with no defects or for devices with a low bit count where there may exist no real or distinct pattern of bit-level errors.

Accordingly, what is needed in the art is an efficient electronic component identification scheme that does not require the addition or existence of external identification material and works for a wide variety of components.

3. SUMMARY OF THE INVENTION

The present invention provides a method for identifying individual components based upon selected physical characteristics. In one embodiment,, a characterization function that will produce a unique characterization value for each individual component within a set of components is (or has been) assigned to the set of components. The characterization function is a function of at least one physical characteristic that is shared by all components within the set of components. Next, for each component, the measurable physical characteristics defined as part of the characterization function are measured, and an individual characterization value, which is calculated from the assigned characterization function, is determined. Each component that is to be subsequently identified is then identified by its associated characterization value. This characterization value can be stored in a database as an identifier for information associated with the component.

4. BRIEF DESCRIPTION OF THE DRAWINGS

FIG. 3 depicts acts for implementing another embodiment of the present invention.

5. DETAILED DESCRIPTION

The present invention relates to the identification of electronic components based upon selected inherent physical characteristics. Electronic component identification by physical characterization, as will be discussed in greater detail below, may be utilized in a variety of settings. In particular, physical characterization identification of components may be exploited in various production applications including component information retrieval, module programming, and component manufacturing quality control. Identification by physical characterization is beneficial because added identification "tags" or "marks" (e.g., barcodes, fuse identification numbers) are not required. In addition, a sufficient number of physical characteristics, which are necessary to produce a unique identification value for each component, may be measured in a relatively minuscule amount of time, thereby making this process valuable in a production environment.

As used herein, the term "component" includes any electronic component possessing a sufficiently diverse array of measurable physical characteristics that make it amenable for physical characterization as taught by the present invention. Such components may be analog, as well as digital, semiconductor devices and include, but are not limited to, memory devices, interface components, latches, amplifiers, and other integrated microcircuit components.

5.1 Component Identification with Physical Characterization

Figure 1:
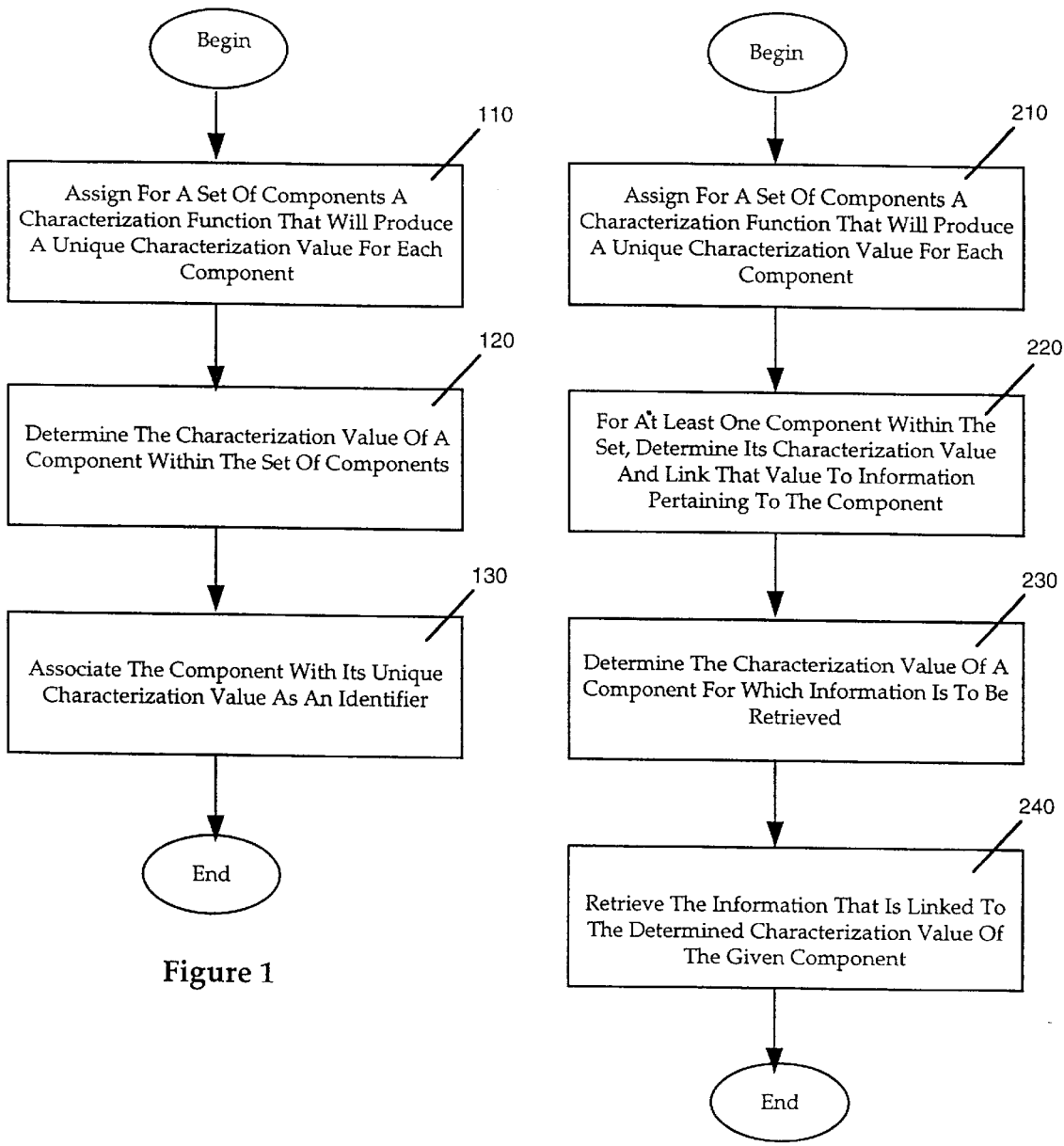
FIG. 1 depicts acts for implementing one embodiment of the present invention.

FIG. 1 generally depicts acts for identifying components by using physical characterization. Initially, at 110, a characterization function that will produce a unique characterization value for each component within a set of components, is assigned to the set of components. Next, at 120, the individual characterization value is determined by measurement for at least one component within the set of components. Finally, at 130, the component to be identified is associated with its unique characterization value, which serves as its identifier. Typically, this association requires recording the individual characterization value in a record-keeping system, such as a computer database.

5.1.1 Physical Characterization Function Assignment

As a first step in employing the present invention, a physical characterization function is assigned to a set of components. The function may either be selected from an existing physical characterization scheme, or it may be derived (or created) for the set of components. The primary considerations in assigning (i.e., selecting or creating) a characterization function are: (1) it should produce a unique characterization value for each component within the set of components, and (2) the physical characteristics, which are the independent variables of the characterization function, should be readily measurable to an acceptable degree of resolution within the component identification environment.

There are two aspects to the assignment of the characterization function to a set of components: the set of components and the characterization function itself.

5.1.1.1 Component Set

A component set may be any set of components sharing a sufficient number of physical characteristics that enable a single characterization function to be assigned to the set. The set may or may not be homogeneous with respect to the type and producer of the components that constitute the set. For example, a given set of components could include multiple types of memory devices such as RAMs (random access memory) and PROMs (programmable read only memory). In contrast, a set could also consist of components of a particular type, e.g., DRAM (dynamic RAM) that may or may not have originated from the same manufacturer or the same production lot. However, the shared physical characteristics that are used for the assigned characterization function should be measurable for each component within the component set without knowledge of the particular component being measured. Thus, the necessary electrical contacts (e.g., pins), as well as any required initialization and set-up, must be sufficiently compatible for consistently measuring the components' relevant physical characteristics, both for an initial determination and subsequent identification.

5.1.1.2 Characterization Function

A characterization function is a mathematical function that both (1) depends upon at least one measurable physical characteristic shared within a set of components, and (2) produces a unique characterization value for each component for a given set of measurement conditions. Thus, a characterization function should depend upon physical characteristics (a) whose normal range sufficiently varies from one component to another within a component set, and (b) which varies within an easy sensitivity range for the test equipment used to measure the characteristics. For a particular component, the characterization function should provide a consistent characterization value (or at least a value predictably varying within an acceptable range), each time its characterization value is determined. This may (and more than likely will) mean that relevant physical characteristics (i.e., those measured characteristics on which the characterization function depends) will either be measured within a tolerable range of test/measurement conditions (e.g., temperature, supply voltage, output impedance), or the function will be defined to depend upon various test/measurement condition variables in addition to relevant physical characteristics.

The term "physical characteristic" refers to the measurable physical characteristics that are associated with semiconductor components. The different measurable physical characteristics that make up a characterization function can consist of (1) a combination of different physical parameters (such as DC electrical characteristics, e.g., output leakage current, output high voltages, and output low voltages; operating currents; capacitances; and AC electrical characteristics including delays and access times), and/or (2) a single physical parameter (such as the actual output high voltage value $V_{OH}$) occurring at a combination of different physical locations within the component. Preferably, the characteristics chosen are ones that can be measured consistently both before the component is installed and at various stages of production of the module in which it is incorporated. Although a characterization function could be defined as a vector or array consisting of each of the individually measured values, storing such a value could consume many bits of storage. Thus, the individually measured values will normally be combined in some fashion by the characterization function to produce a compressed but still unique value.

As used herein, "combining" means using any algorithm by which the individual measured values used in a characterization function are brought together by compression (without loss of information) or by addition, multiplication, weighted summing or other mathematical or logical operations in which information may be lost, while still producing a unique identifier for each component in numeric, alphanumeric or other computer-storable form.

As an example, consider a component set that consists of a number of RAM devices (e.g., a number of 4M ×4 row/column accessible RAM chips). The characterization function assigned to this set must depend upon a sufficient number of varying physical characteristics (from component to component) to ensure that a unique characterization value will be determined for each component. On the other hand, however, the number of necessary physical characteristics is preferably kept low, so that the amount of time required to make the measurements to determine a characterization value for a given component also will be reduced. With components such as memory devices, which include vast pluralities of memory cells (16 million for each device in this example), a good starting place for relevant physical characteristics is to look at the physical characteristics of a subset of the individual cells.

Thus, in this example, a suitable characterization function could simply depend upon the individual output high voltages ($V_{OH}$) for a given definable set of cells. For example, the following characterization function could be assigned to the component set for a given temperature, supply voltage, and output impedance:

CV=sum of the highest 200 $V_{OH}$ levels within the first 40 rows where CV is the characterization value and $V_{OH}$ is the output high voltage level for a given cell. In this example, because each row consists of four cells, the characterization value will equal the sum of the 200 largest cell output high values for the first 800 cells. With this function, the highest values within an arbitrary cell range are utilized in order to reduce the averaging effect of combining (by summing) a large number of individual cell values, which could prevent the function from producing a unique characterization value for each component within the set. However, the efficacy of the function in this regard also depends upon the resolution and precision of the test station used to measure the individual cell values.

Another possible solution to the averaging problem, is to weight various cell values differently as they are combined. For example, another possible characterization function for a given temperature, supply voltage, and output impedance is as follows:

$$CV = \sum_{r=0,}^{4} \sum_{c=0}^{39} \sum_{b=0}^{3} V_{OH} \times 10^b$$

where r represents row, c represents column and b represents bit. Thus, individual bit cell values are weighted differently based upon their bit location, thereby reducing the averaging nature of the summing. Again, however, the effectiveness of this function in a physical characterization identification scheme ultimately depends also upon the precision and resolution of the test station used to measure the relevant physical characteristics.

Another possible approach in formulating a characterization function that produces a unique value for each component within the set of components is to utilize a relatively wide variety of physical characteristic types as relevant physical characteristics and weight them differently. For example, the following characterization function could be utilized with consistent operational conditions (e.g., temperature, supply voltage, output impedance) for a set of memory devices.

$$CV = I_{cc} \left( \sum_{r=0,}^{4} \sum_{c=0,}^{39} \sum_{b=0}^{3} t_{ZL} \times 10^b \right)$$

-continued $$\left( \sum_{r=0,}^{4} \sum_{c=0,}^{39} \sum_{b=0}^{3} V_{OL} \times 10^b \right) \left( \sum_{r=0,}^{4} \sum_{c=0,}^{39} \sum_{b=0}^{3} V_{OH} \times 10^b \right)$$

where $I_{cc}$ is operational supply current, $t_{ZL}$ is the time delay (referenced from a "switching" signal such as a clock or a read signal, depending upon the particular component type) for a given cell to change from a state of high impedance to low, $V_{OL}$ is the actual value of a cell's low output, and $V_{OH}$ is the actual value of a cell's high output.

It should be recognized that a wide variety of possible effective characterization functions can be either created or selected for most component sets. Again, however, the function should produce a consistent, unique characterization value for each component within a given component set, which may then be used as an identifier. The appropriate physical characterization function may vary from company to company for the same type of component. One manufacturer may have a suitable range of normal variance for access time, while another may have too tight a range on this variable but a more suitable normal variance range on output voltages on another characteristic. Once a physical characterization function is selected, its effectiveness for producing an adequately dispersed (and therefore distinct) set of characterization values can be tested for a given population of components.

5.1.2 Characterization Value Determination

To initially determine the characterization value of a component, its relevant physical characteristics are measured under a prescribed set of measurement conditions (as may be dictated by its characterization function). The characterization value is then determined with these physical characteristic measurements "plugged" into the characterization function. With a properly chosen characterization function, the resulting characterization value will be unique for each component and can thus be used as an identifier.

The characterization value may be any number (e.g., real number or integer) that is suitable as an identifier for the measured component. In addition, the characterization value could also be an array of numbers, each corresponding to a different relevant physical characteristic or combination thereof, depending upon the nature of the characterization function assigned to the component set. With this latter type of characterization value, a multiple value array (or vector) would serve to uniquely identify each component within a component set.

Figure 2:
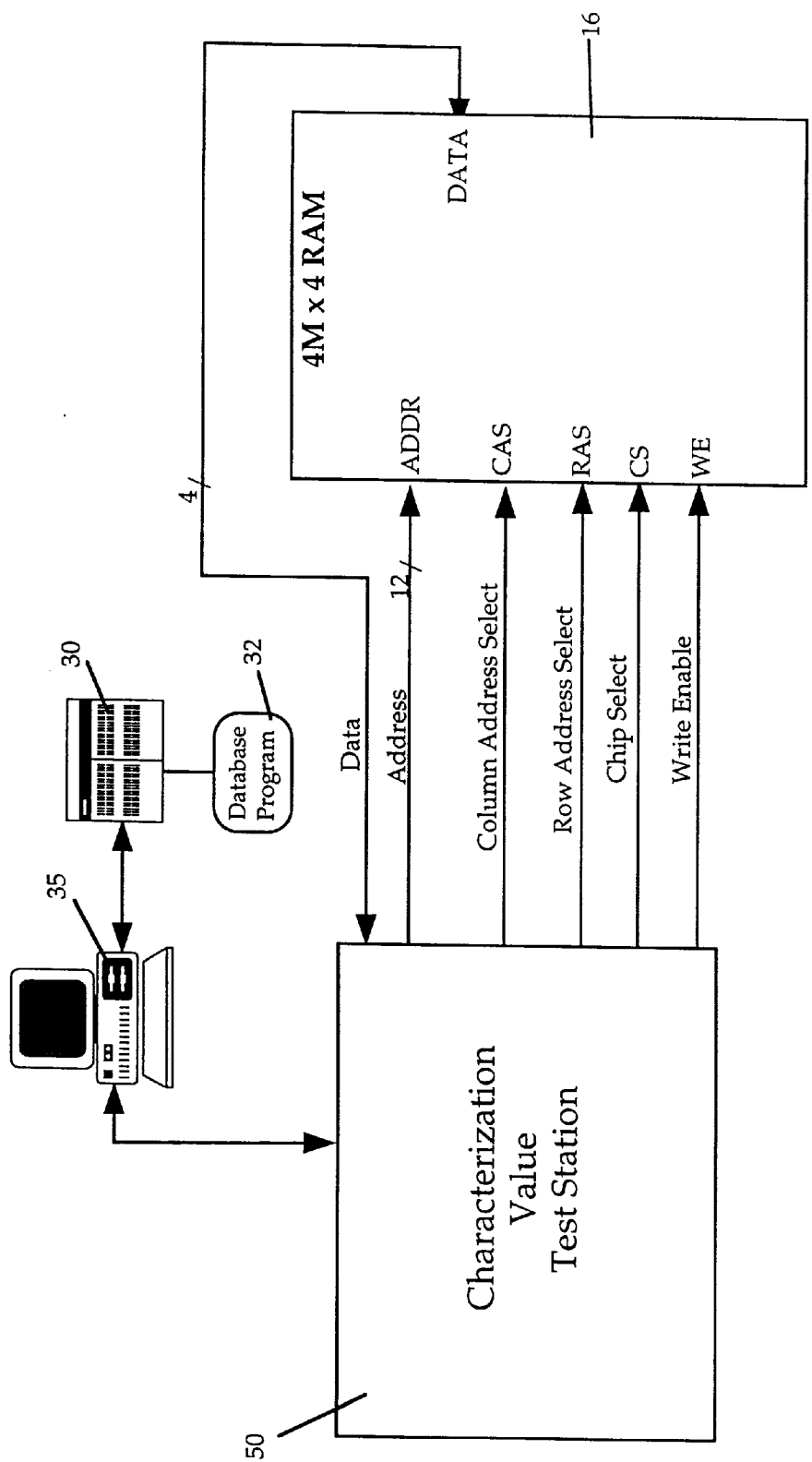
FIG. 2 depicts an embodiment of a system for determining a component's characterization value.

FIG. 2 depicts a system for determining a component's characterization value. A characterization value test station 50 is electronically coupled to component 16, which, by way of example, is a 4M ×4 row/column accessible RAM memory device. The characterization value test station 50 is also coupled to a personal computer 35, which is capable of monitoring and controlling test station 50.

The characterization value test station 50 is utilized to measure a component's relevant physical characteristics. It may be implemented with any test station or test equipment capable of measuring a component's relevant physical characteristics within acceptable resolution and tolerance ranges, under any set of measurement conditions that may be prescribed by the characterization function. For example, with a memory device component set, the characterization value test station 50 could be implemented with a memory tester such as a Teradyne J994™ available from Teradyne, Inc. of Boston, Mass., an Adventest 8551™ available from Adventest of Tokyo, Japan, a Genesis G2™ available from Teradyne, Inc. of Boston, Mass., or a Sigma II™ available from Darkhorse of Austin, Tex. It can be seen that the particular characterization function that may be assigned to a given set of components will depend upon the capabilities of the characterization value test station that is available or that can be designed for the component set.

Computer 35, which is also connected to a network server 30, is utilized to monitor and control the characterization value test station 50. (It should be recognized, however, that depending upon the particular equipment utilized to implement test station 50, computer 35 may or may not be necessary for its monitoring and control). In addition, the computer 35 may be used to calculate (and, thereby, determine) the characterization value from the physical characteristic measurements obtained by the characterization value test station 50. Persons of ordinary skill in the art will recognize that this characterization value determination may be implemented by computer 35 with software designed to calculate the particular characterization function. The characterization value could also be determined by software within the network server 30 or the characterization value test station 50.

5.1.3 Component Identification

Component identification by physical characterization is the association of a component with its characterization value, for use as the component's "identifier." While this association can be confirmed with a label affixed to or in the component, physical characterization makes this unnecessary. Proper selection of the characterization function results in each component inherently carrying its own identifier, based on the particular variants of the relevant measured physical characteristics present in the component. Thus, with this scheme, whenever a component is to be identified (or "labeled"), its characterization value is determined (by measurement and calculation) and recorded in some form, preferably by storage in a computer database list of components.

For an unknown (but previously identified) component, the identification is recovered by repeating measurements and calculations to determine the characterization value. Once this value is determined, the component has its identifier. To recover information associated with the identifier, the identifier is matched (or referenced) against characterization values that were originally determined and stored (e.g., in a database) for at least one component within a set of components. Assuming a characterization value was originally determined for any component that is in the database, a match will occur or may be "forced" based upon a pre-defined criterion or criteria. For example, a characterization value could be forced to match the closest of the referenced originally-determined characterization values. This "forcing" is utilized to compensate for non-ideal conditions, which may result in at least somewhat inconsistent characterization value determinations for a given component.

Component identification of this sort can be utilized in several contexts. In one embodiment, the originally determined characterization value identifiers can be organized into various groups. For example, the groups can be organized by production lot, manufacturer, tolerance, or defect level. Thus, a component is then attributed with the common qualities of a group of components to which it belongs. These qualities can be linked in the database to a stored list of identifiers for each component in the group. This may facilitate inventory or quality control for components in the group.

In another embodiment, each originally determined characterization value identifier is linked in the database to unique information pertaining to the component. With this embodiment, once a characterization value identifier has been found in the database, the information that is linked to the identifier can be retrieved and utilized in connection with the identified component. Information retrieval based on a physical characterization identifier is discussed in greater detail below.

5.2 Component Information Retrieval By Physical Characterization

5.2.1 In General

FIG. 3 shows the general acts for retrieving information after physical characterization identification. Initially, at 210, a characterization function is assigned to the given set of components. At 220, the characterization value is initially determined and linked to component information for at least one component (and more than likely for each component) within the set of components. Thereafter, the components may be mixed with each other, so that any visible individual identification is lost. Later, at 230, the characterization value is again determined for a component for which information is to be retrieved and whose characterization value was initially determined in the previous act. At 240, information that is linked to the later determined characterization value is then retrieved. This retrieved information will pertain specifically to the component for which information is to be retrieved.

The system of FIG. 2 may be utilized to implement this physical characterization information retrieval process. A database program 32 may be executed by network server 30 (or alternatively by computer 35 or characterization value test station 50 ). With such a database program, information pertaining to each component within a component set may be stored in a record. The record for a particular component may then be linked to that particular component's characterization value, after it has been determined. Thus, component characterization values are used as identifiers for the component records of the database.

In one embodiment, known information pertaining to a given component is stored in a selected record of the database. The component's characterization value is then determined at test station 50 and subsequently stored in the same selected record to be used as an identifier for the component. After the characterization value has been determined for each component and stored as an identifier in a distinct record, along with information pertaining to the component, the components may be combined or "mixed-up" together. Thereafter, if information pertaining to a selected component is needed, its characterization value is determined by testing and the database record that contains this value is retrieved along with the other information that pertains to the component.

Information pertaining to a component may be any type of information including: manufacturer, tolerance, and test information, such as defect mapping. In one exemplary embodiment of the present invention, the components are memory devices and a memory tester (e.g., a Teradyne J994™ available from Teradyne, Inc. of Boston, Mass.) is used as the characterization value test station 50. For each memory device 16 from a set of memory devices, the memory tester determines a device's characterization value (which usually takes only a few seconds) and tests the device for bit defects (which may take several minutes, as all bits are tested). The bit defect information and characterization value are stored together in a database record to link the characterization value as an identifier to the bit defect information. After all of the devices have been tested and linked to their characterization value, they can then be combined and distributed for manufacturing or other processes without requiring any added marks or identification materials. Whenever the bit defect information is required for a given component, the component's characterization value is determined and used to retrieve the component's bit defect information from the database.

The retrieved component information can be used in a variety of ways. One particular use is in manufacturing a module in which the manufacturing must be accommodated to individual component characteristics. As will be explained in the next section, with further reference to the example of a memory device 16 for which bit defect information has been stored, the defect information can be used to manufacture a module in which the component-specific defects are circumvented.

5.2.2 Memory Module Production

5.2.2.1 Memory Module

The term memory module refers to any electronic module that includes one or more memory devices. A memory device is a component that includes memory cells for storing bit information. Memory devices may be, but are not limited to, RAM (random access memory), DRAM (dynamic random access memory), EDO DRAM (extended data DRAM), SRAM (static random access memory), VRAM (video random access memory), PROM (programmable read only memory), or EPROM (erasable PROM).

Memory devices can contain millions of memory cells, only a few of which may be defective. Thus, it is desirable to utilize "defective" memory devices (i.e., devices that contain at least one defective cell) in memory modules that overcome the defects rather than completely discarding such devices.

Figure 5:
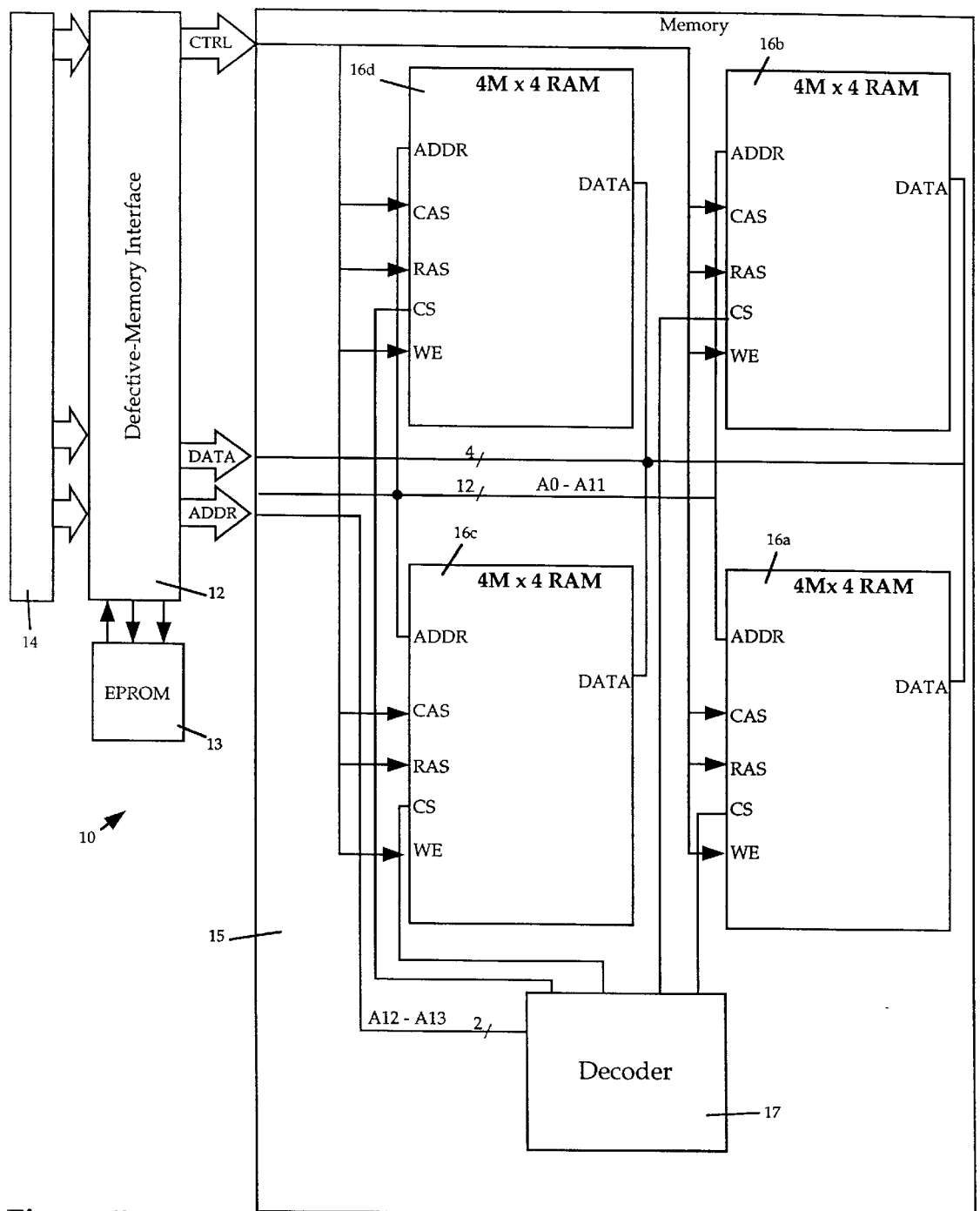
FIG. 5 depicts a block diagram of an embodiment of a memory module.

FIG. 5 depicts one embodiment of a scheme for effectively using memory devices (which may or may not be defective) in a memory module. Memory module 10 includes: memory 15, memory recovery interface 12, and EPROM 13. Memory 15 further includes memory devices 16a–d and decoder 17. (The actual memory module corresponding to the memory module 10 would also include a base, e.g., a printed circuit board, not shown, for housing the various constituent components). The memory recovery interface 12 is coupled to host processor 14, memory 15, and EPROM 13.

Memory recovery interface 12 serves as an interface between a host processor 14 and memory 15. It can be any device (or device combination) that provides to host processor 14 access to memory 15 without alteration of the processor's addressing scheme, while preventing any defective memory cells of memory 15 from being used by the host processor 14. In one embodiment, memory recovery interface 12 is a memory controller ( or combination of read and write memory controllers), as taught by pending U.S. application Ser. No. 08/802,895 now U.S. Pat No. 5,958,065 as of Sep. 28, 1999 entitled CONTENT ADDRESSABLE BIT REPLACEMENT MEMORY, filed on Feb. 18, 1997, which is hereby incorporated by reference into this specification. The memory controller or controllers may be implemented with an ASIC (application specific integrated circuit). With this memory controller embodiment, the memory recovery interface 12 effectively replaces bad cells (or bytes) from memory 15 with good cells (or bytes) from elsewhere (e.g., within memory recovery interface 12 ).

In a second embodiment, memory recovery interface 12 is a logical to logical translator, which diverts access from a bad to a good byte through logical to logical translation. This can be accomplished when memory 15 includes more memory than is required by host processor 14.

Memory devices 16a–d and decoder 17 are organized into a conventional memory array to form memory 15. The four 4M×4 RAM devices are converted into a 16M×4 RAM having 14, rather than 12, address lines. (It is presumed that with each row/column accessible RAM 16a–d, row and column addresses are input separately to the device through a common 12-bit address bus. 12 lines are used for a row address and 10 lines for a column address.) Thus, each 4-bit byte is directly accessible to the memory recovery interface 12. In turn, with bit error information (i.e., defect locations) of memory 15 available to memory recovery interface 12, memory recovery interface 12 can provide to host processor 14 access to memory 15 without alteration of the processor's addressing scheme, while preventing any defective memory cells/bytes of memory 15 from being used. The bit error information is provided to memory recovery interface 12 through EPROM 13 (e.g., the information could be downloaded into internal memory of memory recovery interface 12 during start-up).

5.2.2.2 Embodiment of a Memory Module Production System

Figure 4B:
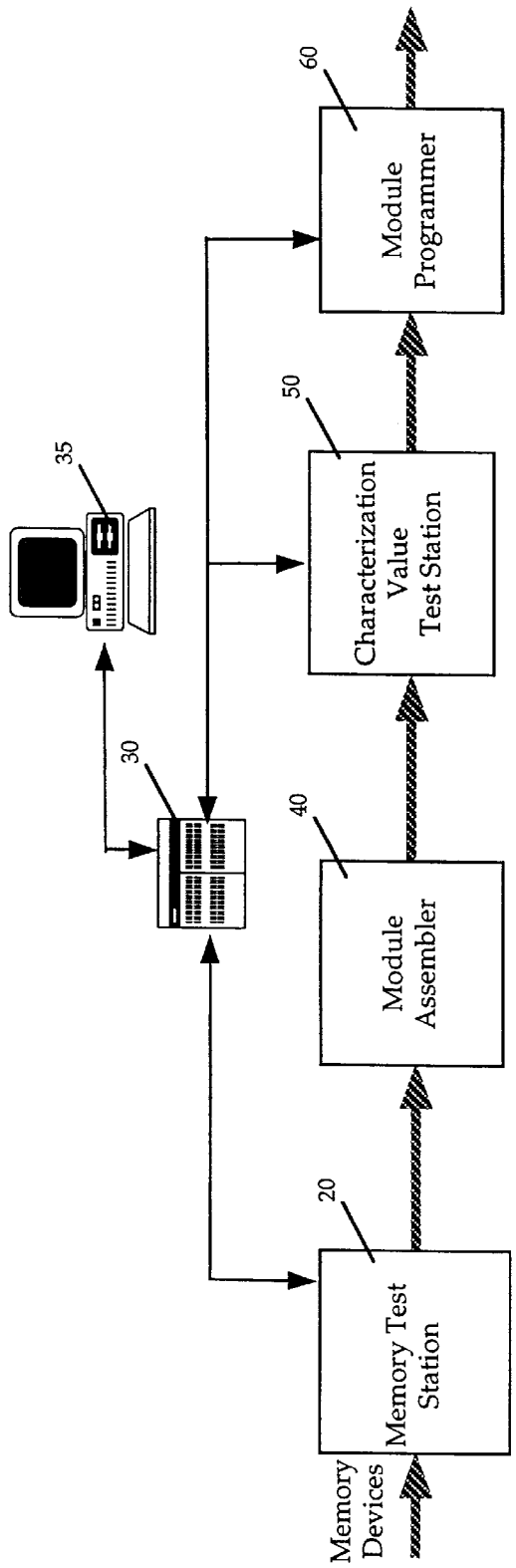
FIG. 4B shows a second embodiment of a system for producing a memory module utilizing physical characterization to identify components and retrieve component-specific data.
Figure 4A:
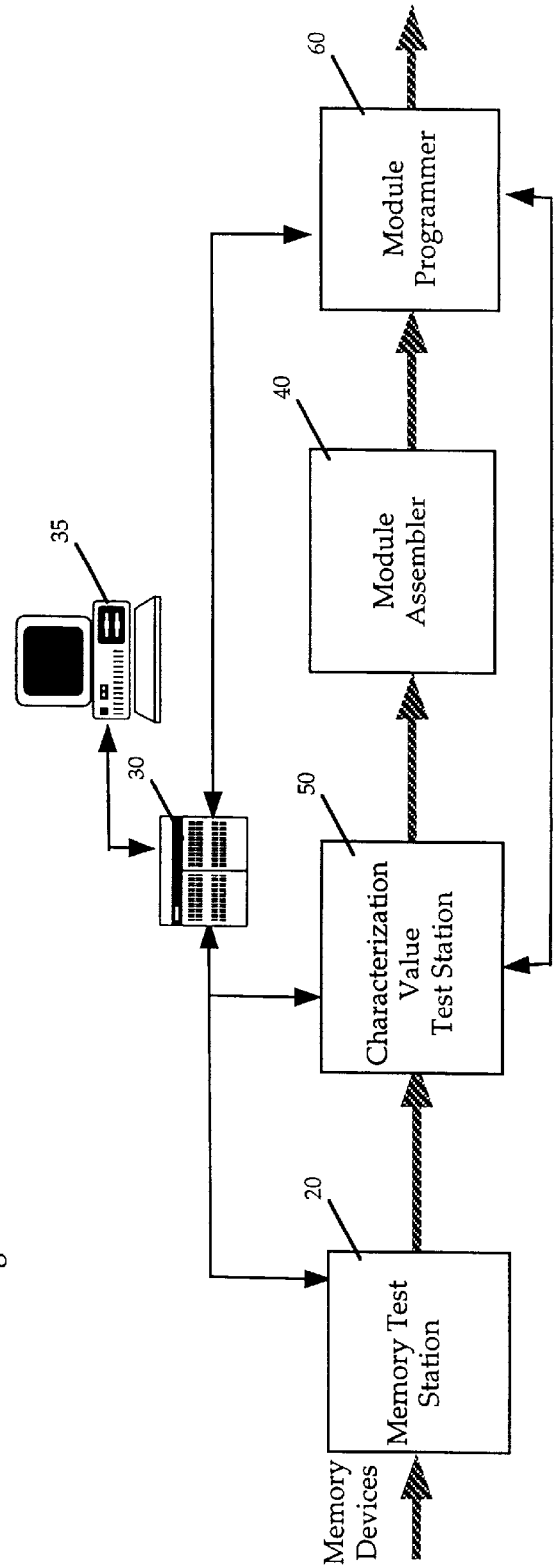
FIG. 4A shows an embodiment of a system for producing a memory module utilizing physical characterization to identify components and retrieve component-specific data.

FIGS. 4A and 4B show embodiments of a system for producing a memory module. Each embodiment includes: a memory test station 20, a computer 35, a network server 30, a module assembler 40, a characterization value test station 50, and a module programmer 60.

Initially, memory devices from a set of memory devices are batch tested for bit defect information at memory test station 20. (Memory test station 20 may be any device or combination thereof that can test and map memory devices for bit errors, as well as determine characterization values for each device. Such a memory test station could be implemented with a memory tester including a Teradyne J994™ available from Teradyne, Inc. of Boston, Mass., an Adventest 8551™ available from Adventest of Tokyo, Japan, a Genesis G2™ available from Teradyne, Inc. of Boston, Mass., or a Sigma II™ available from Darkhorse of Austin, Tex. Memory test station 20 also determines the characterization value for each memory device and stores this value, along with the device's bit defect information, in a record of a database, which may be resident within test station 20, computer 35 or network server 30. With the embodiment of FIG. 4A, a characterization value test station 50 (which may be separate or may be implemented as part of memory test station 20) determines the characterization values for the devices that are to be installed into a memory module. With these values, it retrieves the device's bit defect information and provides this information to module assembler 40. The module assembler 40 then installs the devices into the module base. Finally, the module programmer 60 programs the bit defect information into the memory module (e.g., it "burns" the information into EPROM 13 of FIG. 5).

With the embodiment of FIG. 4B, the characterization value test station 50 is functionally after, rather than before, of module assembler 40. With this embodiment, memory devices from the set of devices are provided to the module assembler 40 after being tested. Here, they are installed into a memory module base. The module is then provided to characterization value test station 50, which includes a loadboard for electrical access to the individual memory devices within the module. The device characterization values are each determined, and their bit defect information is retrieved and provided to module programmer 60. (It should be recognized that with this latter embodiment, a characterization function should be assigned that can tolerate deviations in a device's measured physical characteristics, which may occur when the devices are initially measured individually and, later, as part of a module.)

5.2.3 Component Grade Screening

Retrieved information that is specific to a component may also be used in production processes where products of more than one grade are produced. For example, a product may be made in a commercial grade and a military grade whose components with tighter tolerances or better performance characteristics are required. In the production process the individual components can be identified by their characterization value and a file containing tolerance or quality information retrieved. The retrieved information can be measured against a screening criterion (or criteria). Depending on whether the component meets the criteria or not, the component can be used in production with the higher grade products or the resulting product can be marked as either the higher or lower grade.

5.3 Remarks

A primary benefit of the present invention is that it permits components that are to be assembled in a production process to be identified without needing to apply any physical identifying label to the component. An additional benefit is that the identifying physical characteristics selected as the basis for the initial (and subsequent) identifier for each one of a set of components can be determined in a relatively short period of testing, consistent with on-the-fly identification in production processes. A further benefit is that each identifier can be easily stored in a computer database in association with, and used as a retrieval key for, other information particular to the component identified by the identifier.

5.4 Other Embodiments

While the present invention has been described with reference to several embodiments thereof, those skilled in the art will recognize various changes that may be made without departing from the spirit and scope of the claimed invention.

Accordingly, the invention is not limited to what is shown in the drawings and described in the specification, but only as indicated in the appended claims.

What is claimed is:

1. A method for identifying a component, the method comprising:

assigning for a set of components a characterization function that produces a unique characterization value for each component within the set of components, wherein the characterization function is a function of at least one measureable physical characteristic shared by each component within the set of components;

determining the characterization value of at least one component within the set of components;

associating the at least one component with its characterization value as an identifier such that the at least one component, is re-identifiable by the characterization function; and linking information associated with the at least one component to its characterization value.

2. The method of claim 1, wherein the act of determining the characterization value for at least one component includes the acts of:

measuring a plurality of physical characteristics for the at least one component, thereby producing a plurality of physical characteristic measurements, and combining the plurality of physical characteristic measurements to determine the characterization value.

3. The method of claim 2, wherein the act of assigning for a set of components a characterization function includes assigning for a set of memory devices a characterization function.

4. The method of claim 3, wherein the act of measuring a plurality of physical characteristics for the at least one component includes measuring at least one physical characteristic for each of a plurality of memory cells.

5. The method of claim 2, wherein the act of combining the plurality of physical characteristic measurements to determine the characterization value for a component includes the act of weighting at least one of the physical characteristic measurements for the component.

6. The method of claim 1, wherein the act of determining the characterization value for at least one component comprises:

measuring a plurality of DC characteristics for the at least one component, thereby producing a plurality of DC characteristic measurements, and combining the plurality of DC characteristic measurements to determine the characterization value.

7. The method of claim 6, wherein the act of assigning for a set of components a characterization function includes assigning a characterization function for a set of memory devices.

8. The method of claim 7, wherein the act of measuring a plurality of DC characteristics for the at least one component includes measuring at least one DC characteristic for each of a plurality of memory cells.

9. The method of claim 6, wherein the act of combining the plurality of DC characteristic measurements to determine the characterization value for a component includes weighting at least one of the DC characteristic measurements for each component.

10. The method of claim 1, wherein the act of associating the at least one component with its characterization value as its identifier includes the act of recording the characterization value as an identifier in a list of identifiers, the list corresponding to a group of components that share common qualities.

11. The method of claim 1, wherein the act of associating the at least one component with its characterization value as its identifier includes the act of storing in a database the characterization value as an identifier that is linked to information pertaining to the at least one component.

12. A method for retrieving information on a component, the method comprising:

assigning for a set of components a characterization function that will produce a unique characterization value for each component within the set of components, wherein the characterization function is a function of at least one measurable physical characteristic that is shared by each component within the set of component;

for each of a plurality of components within the set of components, determining its characterization value and linking that value to the component as an identifier and to information pertaining to the components;

determining by subsequent testing the characterization value of a first component from the plurality of components thereby re-identifying the first component; and retrieving information that is linked to the determined characterization value of the first component, whereby the information pertains to the first components.

13. The method of claim 12 further comprising: (1) utilizing the first component as part of an electronic module, and (2) programming the retrieved information into the electronic module.

14. The method of claim 13, wherein the act of assigning for the set of components a characterization function includes assigning for a set of memory devices a characterization function.

15. The method of claim 14, wherein the act of programming the retrieved information into the electronic module includes programming defect information into the electronic module.

16. The method of claim 13, wherein the act of determining by subsequent testing the characterization value of a first component from the plurality of components includes measuring physical characteristics of the first component after it has been installed into the electronic module.

17. The method of claim 12 further comprising utilizing the first component for an electronic module if the retrieved information satisfies a screening criterion.

18. The method of claim 12, wherein an act of determining the characterization value of a component comprises: (1) measuring a plurality of physical characteristics for the component, thereby producing a plurality of physical characteristic measurements, and (2) combining the plurality of physical characteristic measurements to determine the characterization value of the component.

19. The method of claim 18, wherein the act of assigning for a set of components a characterization function, includes assigning for a set of memory devices a characterization function.

20. The method of claim 19, wherein the act of measuring a plurality of physical characteristics for the component includes measuring a physical characteristic of a memory cell from the component.

21. The method of claim 20, wherein the act of combining the plurality of physical characteristic measurements to determine the characterization value of the component includes weighting a group of physical characteristic measurements.

22. The method of claim 12, wherein an act of determining the characterization value of a component comprises (1) measuring a plurality of DC characteristics for the component, thereby producing a plurality of DC characteristic measurements, and (2) combining the plurality of DC characteristic measurements to determine the characterization value.

23. The method of claim 22, wherein the act of assigning for a set of components a characterization function includes assigning for a set of memory devices a characterization function.

24. The method of claim 23, wherein the act of measuring a plurality of DC characteristics for the component includes measuring a DC characteristic for each of a plurality of memory cells from the component.

25. The method of claim 24, wherein the act of combining the plurality of DC characteristic measurements to determine the characterization value includes the act of weighting at least one DC characteristic measurement.

26. A method for producing an electronic module having a memory that includes at least one memory device from a set of memory devices, the method comprising;

testing each of a plurality of memory devices from the set of memory devices, the testing for each memory device including:

acquiring test information on the device, determining a characterization value for the device, wherein the characterization value is determined from a physical characterization function that has been assigned for the set of memory devices and that has been determined to produce a unique characterization value, linking the test information on the device to the unique characterization value such the unique characterization value identifies the test information:

storing in a database the test information linked to the characterization value, wherein the test information for each of the plurality of memory devices is retrievable from the database with the device's characterization value;

installing a first memory device, from the plurality of memory devices, into an electronic module;

determining the characterization value of the first memory device thereby identifying the first memory device;

with the determined characterization value, retrieving from the database the test information for the first memory device; and programming the retrieved test information into the electronic module.

27. The method of claim 26, wherein the act of programming the retrieved test information into the electronic module comprises programming bit defect information for the first memory device into a programmable memory device.

28. The method of claim 27, wherein the act of programming bit defect information for the first memory device into a programmable memory device comprises programming the bit defect information into a programmable memory device that is accessible to a memory recovery interface of the electronic module.

29. A method for producing a memory module having (1) a base, (2) memory including a first memory device, and (3) a memory recovery interface to interface between a host processor and the memory, wherein the memory recovery interface provides the host processor access to the first memory device without requiring alteration of the processor's addressing scheme, while preventing any defective memory cells of the first memory device from being used by the host processor, the method comprising:

testing each of a plurality of memory devices from a set of memory devices that each include a plurality of cells, the testing for each memory device including:

acquiring defect information for the cells of the device, determining a characterization value for the device, wherein the characterization value is determined from a physical characterization function that has been assigned for the set of memory devices and wherein the characterization value for each device will be a unique product of the physical characterization function such that characterization value identifies the device; and linking the characterization value to the defect information;

storing in a database the defect information linked to the characterization value, wherein the defect information for each of the plurality of memory devices is retrievable from the database with the device's characterization value;

installing a first memory device, from the plurality of memory devices, into a base;

determining the characterization value of the first memory device thereby identifying the first memory device;

with the determined characterization value, retrieving from the database the defect information for the first memory device; and programming the defect information for the first memory device into the module thereby enabling the memory recovery interface to prevent defective cells from being used.

30. The method of claim 29, wherein the act of programming the defect information into the electronic module comprises programming a logic device based on the defect information.

31. The method of claim 30, wherein the act of programming a logic device comprises storing the defect information into a programmable memory device that is accessible to the memory recovery interface.

* * * * *